United States Patent [19]

Hanak

[11] Patent Number: 4,525,375
[45] Date of Patent: Jun. 25, 1985

[54] METHOD OF CONTROLLONG THE DEPOSITION OF HYDROGENATED AMORPHOUS SILICON AND APPARATUS THEREFOR

[75] Inventor: Joseph J. Hanak, Lawrenceville, N.J.

[73] Assignee: RCA Corporation, New York, N.Y.

[21] Appl. No.: 479,449

[22] Filed: Mar. 28, 1983

[51] Int. Cl.³ .......................... B05D 3/06; C23C 13/08
[52] U.S. Cl. ........................................ 427/8; 118/50.1;
 118/665; 118/712; 118/723; 427/39; 427/74
[58] Field of Search .............. 118/665, 712, 723, 50.1;
 427/8, 39, 74

[56] References Cited

U.S. PATENT DOCUMENTS 4,033,287 7/1977 Alexander, Jr. et al. ........... 118/723
4,223,048 9/1980 Engle, Jr. .............................. 427/39
4,328,258 5/1982 Coleman ............................... 427/39

Primary Examiner—Evan K. Lawrence
Attorney, Agent, or Firm—Birgit E. Morris; Donald S. Cohen; James M. Trygg

[57] ABSTRACT

An improved method and apparatus for the controlled deposition of a layer of hydrogenated amorphous silicon on a substrate. Means is provided for the illumination of the coated surface of the substrate and measurement of the resulting photovoltage at the outermost layer of the coating. Means is further provided for admixing amounts of p type and n type dopants to the reactant gas in response to the measured photovoltage to achieve a desired level and type of doping of the deposited layer.

12 Claims, 1 Drawing Figure

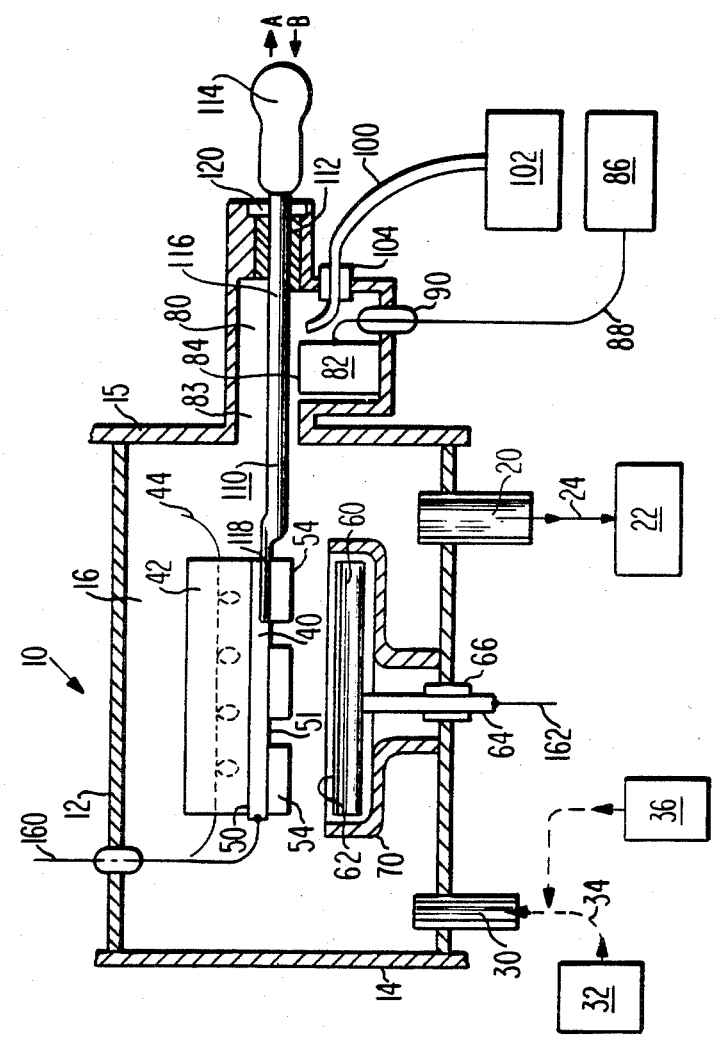

METHOD OF CONTROLLONG THE DEPOSITION OF HYDROGENATED AMORPHOUS SILICON AND APPARATUS THEREFOR

The Government has rights to this invention pursuant to a government contract.

BACKGROUND OF THE INVENTION

This invention relates to the deposition of hydrogenated amorphous silicon films or certain alloys thereof on substrates and, in particular, to an improved method and apparatus for control thereof.

Photovoltaic solar cells made of thin film semiconductor layers, such as hydrogenated amorphous silicon (a-Si:H) may be made in a sandwich structure consisting of p i n layers. Such structures are well known in the art and typically the p type layer is boron-doped and of a thickness of about 10 nm, the i type, or intrinsic, layer is undoped and of a thickness of about 500 nm, and the n type layer is phosphorus-doped having a thickness of about 10–30 nm. The electron/hole pairs are generated in the i layer and collected by virtue of the built-in electric field which results due to the junctions formed by the p and n layers with the i layer. When i layers are grown they may ultimately be characterized as slightly n type ($n^-$) or slightly p type ($p^-$) depending on the background impurities caused by other materials being present within the chamber during the deposition process. It is existing practice in the art to grow the i layer without strictly controlling the characteristic $p^-$ or $n^-$ that the i layer may take. The reason for this is that at the present time, there are no known methods for measuring such low levels of impurities, of the order of $10^{-6}$, in a glow discharge atmosphere during deposition. The resulting type of the i layer ($p^-$ or $n^-$) can have a substantial influence on the conversion efficiency of a particular solar cell structure.

The present invention permits precise control of the characteristic $p^-$ or $n^-$ that the i layer may take by the novel use of the photovoltaic properties of the outer surface of the i layer being grown. That is, since only a very thin outer layer of a-Si:H will absorb a substantial amount of light of a particular frequency a photovoltage is thereby generated at its surface which is indicative of it characteristic $p^-$ or $n^-$ type.

SUMMARY OF THE INVENTION

According to the present invention, there is provided a coating apparatus and method for the deposition of hydrogenated amorphous silicon (a-Si:H) layers or semiconducting alloys of such layers on substrates. The apparatus includes an evacuable chamber having a support member contained therein for supporting the substrate or object to be coated. A reactant gas is disposed throughout the interior of the chamber. A charging means is provided for inducing a glow discharge in the reactant gas adjacent the substrate, or other object to be coated. The glow discharge activates the silane gas which then forms a-Si:H when it impinges on a solid surface. A means is provided for illuminating the surface of the substrate within the chamber with radiation of a predetermined wavelength. Further means is provided for measuring the photovoltage at the outer most surface of the illuminated substrate and for admixing amounts of p type dopant and n type dopant to the reactant gas in response to the measured photovoltage to achieve a desired level and type of doping of the deposited layer.

BRIEF DESCRIPTION OF THE DRAWING

The FIGURE is a longitudinal cross-section view of a reactor in schematic representation form incorporating the teachings of the present invention.

DESCRIPTION OF THE PREFERRED EMBODIMENT

Referring to the FIGURE, there is shown a reactor 10 having a body 12, which may be of cylindrical or other convenient shape, and a pair of ends 14 and 15 which form an enclosed interior chamber 16. The ends 14 and 15 are joined to the body 12 so that the chamber may be evacuated to a pressure of the order of $10^{-6}$ torr. An outlet port 20 is formed in the body 12 adjacent one end of the chamber 16 and is in communication with a vacuum pump assembly 22 through a suitable conduit 24. The vacuum pump assembly 22 is of the usual configuration for such applications, generally including a filter, vacuum gage, shut-off valve, roots blower, and mechanical vacuum pump, all of which are well known in the art and therefore will not be described further here. An inlet port 30 is formed in the body 12 adjacent the other end of the chamber 16 and is in communication with a source 32 of reactant gas through a suitable conduit 34. The source 32 of the reactant gas may include bottles containing silane ($SiH_4$) and a carrier gas argon (Ar), or any other reactant gases commonly used for this purpose, and is interconnected with suitable valving, flow meters, and leak valves. As schematically shown in the FIGURE, means 36 is provided for admixing amounts of p type dopant and n type dopant to the reactant gas of the source 32. These devices and their application to systems for deposition of hydrogenated silicon are well known in the art and therefore will not be further described here.

A substrate holder 40 is disposed within the chamber 16 in heat exchange contact with a heating element 42 having embedded therein a resistive heating winding 44. The winding 44 is electrically connected to a suitable power source located outside the chamber 16. The substrate holder 40 is rigidly held in place by suitable brackets, not shown, that extend and are attached to the inner wall of the body 12. The heating element 42 is attached to the surface 50 of the substrate holder 40 by any suitable means such as screw fasteners, not shown. A plurality of substrates 54 that are to receive a coating of hydrogenated amorphous silicon (a-Si:H) are attached to the surface 51 of the holder 40 by means of spring clips, not shown, or other mechanical clamps that are commonly used for this purpose. The substrate holder 40 may be fabricated from any suitable material that is electrically conductive such as graphite, molybdenum, stainless steel, and the like, thus forming an electrode within the reactor chamber 16.

A second electrode 60, being of the same general shape and size as the substrate holder 40, is disposed adjacent and spaced apart therefrom as shown in FIG. 1. A surface 62 of the electrode 60 is arranged substantially parallel to the substrate holder surface 51. The electrode 60 is supported within the chamber 16 by a cylindrical rod 64, made of a material similar to that of the electrode 60, which projects through the body 12 and is rigidly held in place by a bushing 66. The rod 64 and body 12 are suitably sealed to assure adequate evacuation of the chamber 16 by the pump assembly 22. A shroud 70 is arranged to closely conform to and be spaced apart from the surfaces of the electrode 60 and rod 64 except for the surface 62. This arrangement prevents, or inhibits deposition on the surfaces of the electrode 60 and rod 64 exclusive of the surface 62 in a manner that is well known in the art.

In the present embodiment of this invention, the reactor 10 includes a second chamber 80 which is in communication with the chamber 16 via a narrow passageway 83 formed in the end 15 as shown in FIG. 1. An electrostatic millivoltmeter 82 is disposed within the second chamber 80 so that the voltage sensor 84 is adjacent the passageway 83. One commercially available millivoltmeter that is suitable for this purpose is the "Isoprobe Electrostatic Millivoltmeter, Model 162 S/N, manufactured by Monroe Electronics Inc., Lyndonville, N.Y.". The millivoltmeter is electrically connected to a power source 86 via the circuit 88 which enters the second chamber 80 through a suitable seal 90. A waveguide 100 is arranged for guiding electromagnetic radiation from a radiation source 102 to the interior of the second chamber 80 proximate to the voltage sensor 84. In the present embodiment of this invention, electromagnetic radiation having a wavelength of approximately 400 nm (visible blue light) is used for reasons that will become apparent later. The waveguide 100 comprises a bundle of optical fibers which enter the second chamber 80 through a suitable seal 104. The seals 90 and 104 are sufficiently tight so that adequate evacuation of the chambers 16 and 80 by the pump assembly 22 is assured.

A manually operable transport member 110 is supported in a bushing 112 for sliding movement as indicated by the arrows A and B shown in FIG. 1. The transport member 110 includes a handle 114, a shank 116 of cylindrical shape, and a substrate holder end 118 to which is attached a substrate 54 in the manner described above. An annular seal 120, is arranged to engage the outer circumference of the shank 116 so that the pressure within the evacuated chambers 16 and 80 is maintained while permitting sliding movement of the transport member 110. There are a variety of commercially available shaft seals suitable for this purpose.

In operation, several substrates 54, or other objects to be coated, are attached to the surface 51 of the substrate holder 40 and one is attached to the end 118 of the transport member 110. A constant temperature of about 250° C. is maintained within the substrates by applying a suitable voltage to the resistive heater windings 44. A dry nitrogen gas is introduced into the chambers 16 and 80 for continuous purging thereof. Apparatus for purging is well known in the art and therefore is not shown. The chambers 16 and 80 are then evacuated to a pressure of about 0.1 to 0.2 torr and maintained at this pressure by means of a controlled dry nitrogen leak for about ten minutes. Silane gas from the source 32 is then introduced through the inlet port 30 and into the chamber 16. Since the passageway 82 is very narrow, little or no deposition of a-Si:H will occur within the chamber 80. As the silane gas flows over the surfaces of the substrates, a potential of 200 to 900 volts D.C. or a suitable A.C. voltage of approximately 13.6 megahertz is applied to the substrate holder 40 and the electrode 60 via the leads 160 and 162 respectively. This causes a glow discharge to occur thereby depositing a-Si:H on the surface of the substrates 54.

Periodically, as the a-Si:H film grows, the transport member is manually moved in the direction as indicated by the arrow A until the substrate 54 attached to the end 118 is directly over the voltage sensor 84 and is illuminated by blue light from the optical fiber waveguide 100. The surface photovoltage of the outer most layer of a-Si:H is sensed by the sensor 84 and indicated on a suitable display device. This voltage, as mentioned above, is indicative of the characteristic type ($p^-$ or $n^-$) of the layer that is being grown. A relatively thin layer, about 10–20 nm thick, of a-Si:H will absorb a substantial amount of blue light, having a wavelength of approximately 400 nm. If the thin layer is of $p^-$ type, a substantial negative photovoltage will be thereby generated at the surface which may be monitored. Conversely, if the a-Si:H layer is of $n^-$ type the photovoltage at the surface will be nearly zero. Therefore, a given film having a very thin outer layer will have a surface photovoltage characteristic of the $p^-$ or $n^-$ type of the outer layer independent of the type of the underlying layers of the film. It is a simple matter then to admix amounts of $B_2H_6$ or $PH_3$, or some other appropriate impurity to the reactant gas, to adjust the characteristic type of succeeding layers to that which is desired, e.g., $p^-$, $n^-$ or fully compensated.

By way of example, surface photovoltage measurements were taken of two sample substrates, each having a layer of a-Si:H deposited thereon. The first sample having been lightly doped with a small excess of diborane ($B_2H_6$) exhibited a $p^-$ type and the second sample having been lightly doped with a small excess of phosphine ($PH_3$) exhibited an $n^-$ type. Surface voltage measurements of the two samples with respect to a gold film were taken in complete darkness resulting in a measured surface voltage of 840 mV for both $n^-$ and $p^-$ type layers. There was no discernible difference in the surface voltage for the two samples. Surface photovoltage measurements were then taken of the same samples while being illuminated by blue light. The light source was white light having an intensity near AM1 which was then passed through a blue filter. The intensity of the blue light was not determined. The first sample yielded a surface photovoltage of $-190$ mV while the second sample yielded a surface photovoltage of zero. Such a substantial difference in photovoltage output of the two samples indicates that this technique of determining the characteristic $p^-$ or $n^-$ type of the a-Si:H layers is extremely sensitive.

While a specific process and structure for the deposition of hydrogenated amorphous silicon and the monitoring and control of its characteristic $p^-$ or $n^-$ type has been described herein, it will be understood by those skilled in the art that variations may be made without departing from the spirit and intent of the presently disclosed inventive concept. The reactor itself may be any one of a variety of rf or dc glow discharge, rf reactive sputtering, or CVD reactors known in the art. Further, as an alternative to moving the substrate 54 being coated into the second chamber 80 for illumination and measurement, it would be equally satisfactory to move the illuminating tip of the fiber optic cable 100 and the millivoltmeter 82 into close proximity to the substrate for measurement. Another equally satisfactory arrangement would be to permanently position the illuminating tip of the cable 100 and the voltage sensor 84 of the millivoltmeter 82 adjacent the substrate 54 within the chamber 16. A shroud and suitable shutter arrangement would inhibit or prevent deposition on the surfaces of the voltage sensor 84 and the illuminating tip of the cable 100. These structures are considered obvious variations of the invention disclosed herein.

I claim:

1. An apparatus for deposition of a doped layer of hydrogenated amorphous silicon or semiconducting alloys thereof on a substrate, or the like, wherein the outermost layer of the deposited material generates a photovoltage in response to radiation indicative of the level and type of doping comprising:
   (a) a reactor having an evacuable chamber;
   (b) a support means disposed within said chamber for supporting said substrate;
   (c) means in communication with said chamber for evacuation thereof;
   (d) inlet means in communication with said chamber for introducing a reactant gas into said chamber;
   (e) charging means for forming a plasma from said reactant gas adjacent the surface of said substrate and inducing a glow discharge;
   (f) illumination means for illuminating the surface of said substrate with radiation having a predetermined wavelength;
   (g) measurement means for measuring the photovoltage at the outermost surface of said illuminated substrate; and
   (h) means for admixing amounts of p type dopant or n type dopant to said reactant gas in response to said measured photovoltage.

2. The apparatus as set forth in claim 1 wherein said predetermined wavelength is between 3000 angstroms and 5000 angstroms.

3. The apparatus set forth in claim 2 wherein said predetermined wavelength is about 4000 angstroms.

4. The apparatus set forth in claim 3 wherein said charging means is arranged so that said plasma is formed in only a first portion of said chamber and wherein said illumination means and said measurement means are disposed in a second portion of said chamber.

5. The apparatus set forth in claim 4 including transport means for moving said substrate from said first portion to said second portion and back to said first portion of said chamber.

6. The apparatus as set forth in claim 5 wherein said measurement means comprises an electrostatic millivoltmeter.

7. The apparatus as set forth in claim 6 wherein said illumination means includes a fiberoptic cable.

8. The apparatus set forth in claim 4 including transport means for moving said illumination means and said measurement means from said first portion to said second portion and back to said first portion of said chamber.

9. A method for deposition of a doped layer of hydrogenated amorphous silicon or semiconducting alloys thereof on a substrate wherein the outermost layer of the deposited material generates a photovoltage in response to radiation indicative of the level and type of doping comprising the steps of:
   (a) loading at least one substrate into a chamber of a reactor;
   (b) heating said at least one substrate;
   (c) evacuating said chamber to a subatmospheric pressure;
   (d) introducing a reactant gas at subatmospheric pressure into said chamber so that a continuous flow of said reactant gas is effected over a surface of said at least one substrate;
   (e) applying a voltage to said reactant gas whereby a plasma is formed within the chamber adjacent said surface causing a glow discharge to occur which results in the deposition of said doped layer;
   (f) illuminating said doped layer with said radiation;
   (g) measuring the photovoltage at the outermost surface of said doped layer; and
   (h) admixing amounts of p type dopant or n type dopant to said reactant gas in response to said measured photovoltage to achieve a desired level and type of doping of the deposited layer.

10. The method as set forth in claim 9 wherein said radiation has a wavelength between 3000 angstroms and 5000 angstroms.

11. The method as set forth in claim 10 wherein said radiation has a wavelength of about 4000 angstroms.

12. The method as set forth in claim 11 including the step of moving said at least one substrate to a position in proximity to and adjacent said illuminating means and measuring means prior to step (f).

* * * * *

UNITED STATES PATENT AND TRADEMARK OFFICE
CERTIFICATE OF CORRECTION

PATENT NO. : 4,525,375

DATED : June 25, 1985

INVENTOR(S) : Joseph John Hanak

It is certified that error appears in the above-identified patent and that said Letters Patent is hereby corrected as shown below:

Title page, "CONTROLLONG" should be --CONTROLLING--.

Column 1, line 1, "CONTROLLONG" should be --CONTROLLING--.

Signed and Sealed this

Fifteenth Day of October 1985

[SEAL]

Attest:

DONALD J. QUIGG

Attesting Officer

Commissioner of Patents and Trademarks—Designate